United States Patent [19]

Matsumura

[11] Patent Number: 4,764,688
[45] Date of Patent: Aug. 16, 1988

[54] OUTPUT CURRENT DARLINGTON TRANSISTOR DRIVER CIRCUIT

[75] Inventor: Ken Matsumura, Odawara, Japan

[73] Assignee: Kabushiki Kaisha Toshiba, Kawasaki, Japan

[21] Appl. No.: 21,700

[22] Filed: Mar. 4, 1987

[30] Foreign Application Priority Data

Apr. 25, 1986 [JP] Japan ................................. 61-96387

[51] Int. Cl.$^4$ .......................... H03K 3/26; H03K 3/01
[52] U.S. Cl. .................................. 307/270; 307/315; 307/475; 307/296 R
[58] Field of Search ............... 307/315, 400, 270, 475, 307/300, 296.1–296.6; 357/46

[56] References Cited

U.S. PATENT DOCUMENTS

| 3,586,877 | 6/1971 | Aridas | 307/315 |
| 4,318,011 | 3/1982 | Zeis | 307/300 |
| 4,404,478 | 9/1983 | Rischmüller | 307/315 |
| 4,607,171 | 8/1986 | Hellegaard | 307/315 |
| 4,616,144 | 10/1986 | Hideshima et al. | 307/315 |

Primary Examiner—Stanley D. Miller
Assistant Examiner—B. P. Davis
Attorney, Agent, or Firm—Finnegan, Henderson, Farabow, Garrett and Dunner

[57] ABSTRACT

A detection circuit detects the ON-stage of the transistor at the post-stage of the output circuit. A base current-supply circuit is switched to the ON-state, according to the detection output of the detection circuit, so that a current is supplied from the supply-circuit to the base of the transistor at the pre-stage of the output circuit.

11 Claims, 6 Drawing Sheets

OUTPUT CURRENT DARLINGTON TRANSISTOR DRIVER CIRCUIT

BACKGROUND OF THE INVENTION

The present invention relates to an output current driver circuit which is provided in a bipolar integrated circuit serving as an interface driver or the like, and, more particularly, to a circuit wherein an output transistor circuit comprises two darlington-connected NPN transistors.

Figure 1:
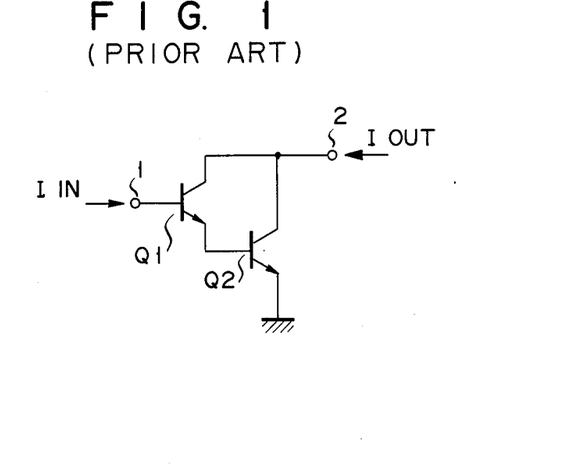
FIGS. 1 and 2 are diagrams showing conventional output current driver circuits.
Figure 2:
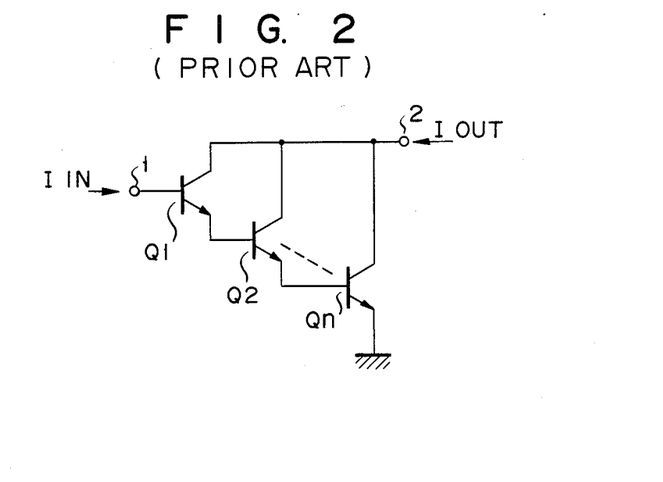

Known conventional circuits for increasing the output current of an output current driver circuit of a bipolar integrated circuit can be classified into two types. The first type is an output transistor circuit comprising two NPN transistors $Q_1$ and $Q_2$ darlington-connected as is shown in FIG. 1. The second type is an output transistor circuit comprising three or more NPN transistors $Q_1, Q_2, \ldots, Q_n$ darlington-connected as is shown in FIG. 2.

In FIG. 1, when an input current to an input terminal 1 assumes $I_{in}$, and current-amplification factors of transistors $Q_1$ and $Q_2$ assume $h_{FEQ1}$ and $h_{FEQ2}$, an output current $I_{out}$ of an output terminal 2 will be $$I_{out} = I_{in} \times h_{FEQ1} \times h_{FEQ2} \qquad (1)$$

As understood from equation (1), according to the transistor circuit of FIG. 1, it is possible to obtain an output current which is $h_{FEQ2}$ times larger than the output current ($I_{in} \times h_{FEQ1}$) of the circuit comprising only output transistor $Q_1$.

Assuming that the threshold voltages of transistors $Q_1$ and $Q_2$ are $V_{BEQ1}$ and $V_{BEQ2}$ and that a saturation voltage across the collector and emitter of transistor $Q_1$ is $V_{CE(SAT)Q1}$, the threshold voltage $V_{THt}$ and the output saturation voltage $V_{CE(SAT)t}$ of the output transistor circuit will be $$V_{THt} = V_{BEQ1} + V_{BEQ2} \qquad (2)$$

$$V_{CE(SAT)t} = V_{CE(SAT)Q1} + V_{BEQ2} \qquad (3)$$

On the other hand, in the circuit of FIG. 2, since there are a number of darlington-connected output transistors, output current $I_{out}$, larger than that of the circuit of FIG. 1, is derived.

However, in the circuit of FIG. 2, assuming that the threshold voltages of transistors $Q_1, Q_2, \ldots, Q_n$ are represented by $V_{BEQ1}, V_{BEQ2}, \ldots,$ and $V_{BEQn}$ and that a saturation voltage across the collector and emitter of transistor $Q_1$ is represented by $V_{CE(SAT)Q1}$, threshold voltage $V_{THt}$ and output saturation voltage $V_{CE(SAT)t}$ of the output transistor circuit will be $$V_{THt} = V_{BEQ1} + V_{BEQ2} + \ldots + V_{BEQn} \qquad (4)$$

$$V_{CE(SAT)t} = V_{CE(SAT)Q1} + V_{BEQ2} + \ldots + V_{BEQn} \qquad (5)$$

Therefore, the values of $V_{THt}$ and $V_{CE(SAT)t}$ increase by amounts equal to the number of darlington-connected transistors. Therefore, the use of the circuit is limited. Namely, when threshold voltage $V_{THt}$ is large, the operating power source voltage of the circuit must be increased. When output saturation voltage $V_{CE(SAT)t}$ is large, the electric power consumption of the circuit increases, giving rise to such problems as excessive heat generation and the like. Thus, the increase in number of transistors limits the use of the circuit.

Therefore, in order to increase output current $I_{out}$ in the circuit arrangement of FIG. 1 in which only two transistors are used, conductivities of output transistors $Q_1$ and $Q_2$ may be ehhanced (in particular, the size of transistor $Q_2$ is enlarged). However, this method results in an undesirable increase in the size of transistors $Q_1$ and $Q_2$, when an integrated circuit is formed, so that the circuit chip must also be enlarged. Consequently, the cost of the resulting chip is higher. Therefore, this method is unsuitable.

SUMMARY OF THE INVENTION

The present invention has been conceived in order to solve the foregoing problem wherein, when it is intended to increase the output current of an output current driver circuit, the size, and cost of the chip are undesirably increased.

It is an object of the present invention to provide an output current driver circuit of a bipolar integrated circuit, in which the output current can be enlarged, with only a small increase in size and cost of the circuit chip.

An output current driver circuit of the present invention comprises:

an output circuit in which a pre-stage NPN transistor and a post-stage NPN transistor are darlington-connected between a current-output terminal and a predetermined-potential terminal, and the base of said pre-stage transistor is connected to a current-input terminal;

a post-stage on-detection circuit which is connected between the base of said post-stage transistor of said output circuit and said predetermined-potential terminal, detects the ON-state of said post-stage transistor, and generates a detection output from an output detection terminal; and a base current-supply circuit which is made operative by the detection output of said post-stage on-detection circuit, and which generates an output current and supplies the output current to the base of said pre-stage transistor of said output circuit.

When the transistor at the post stage of the output circuit is ON, the base current-supply circuit is made operative by the detection output of the detection circuit, and the resulting output current is supplied to the base of the transistor at the first stage of the output circuit. Thus, the base current flowing through the first-stage transistor increases, so that the output circuit operates in a stable saturation region. The output saturation voltage decreases, and the output current flowing through the current-output terminal increases. Therefore, it is not necessary to enlarge the size of the darlington-connected transistors of the output circuit. The detection circuit and auxiliary circuit only are required. Therefore, the size and cost of the chip do not increase.

DETAILED DESCRIPTION OF THE PREFERRED EMBODIMENTS

An embodiment of the present invention will be described in detail hereinbelow, with reference to the drawings.

Figure 3:
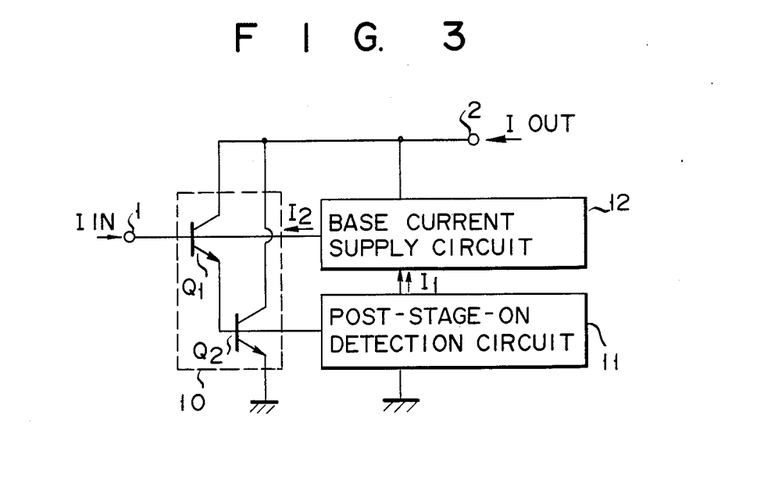
FIG. 3 is a diagram showing a fundamental circuit of the present invention.

FIG. 3 shows an output current driver circuit provided in a bipolar integrated circuit. An output circuit 10 comprises two NPN output transistors $Q_1$ and $Q_2$ which are darlington-connected, and in which a common node of the collectors is connected to current-output terminal 2, the base of transistor $Q_1$, at the front stage, is connected to current-input terminal 1, and the emitter of transistor $Q_2$, at the post stage, is grounded. An OUTPUT-ON-STATE detection circuit 11 for detecting the ON-state of post-stage transistor $Q_2$ is connected between the base of transistor $Q_2$ and the ground potential. Detection circuit 11 is turned on by a voltage across the base and emitter of transistor $Q_2$. A base current-supply circuit 12 is connected between current-output terminal 2 and the base of pre-stage transistor $Q_1$ and is driven by an ON-detection output current $I_1$ from detection circuit 11 and generates an output current $I_2$. Base current-supply circuit 12 supplies output current $I_2$ to the base of transistor $Q_1$.

When transistors $Q_1$ and $Q_2$ in output circuit 10 are sequentially turned on by input current $I_{in}$, the ON-state of transistor $Q_2$ is detected by detection circuit 11. Base current-supply circuit 12 is turned on by detection output current $I_1$, and output current $I_2$ of base current-supply circuit 12 is supplied to the base of pre-stage transistor $Q_1$. Thus, a base current of (input current $I_{in}$+output current $I_2$ of base current-supply circuit 12) flows into transistor $Q_1$.

Therefore, the operations of transistors $Q_1$ and $Q_2$ take place in a stable saturation region. Consequently, the output saturation voltage $V_{CE(SAT)t}$ of the output circuit (=saturation voltage $V_{CE(SAT)Q1}$ across the collector and emitter of pre-stage transistor $Q_1$+voltage $V_{BEQ2}$ across the base and emitter of post-stage transistor $Q_2$) decreases, and the output resistance of the output circuit is equivalently reduced, so that output current $I_{out}$ increases. According to the foregoing circuit, transistors $Q_1$ and $Q_2$ of output circuit 10 are not increased in size. Only detection circuit 11 for detecting the ON-state of post-stage transistor $Q_2$ and base current-supply circuit 12 need be used, which require less areas on the circuit chip. The increase in the cost of the chip is very small.

As has been described above, according to the foregoing circuit, a large output current $I_{out}$ can be obtained with merely a slight increase in the size and cost of the chip.

Figure 4:
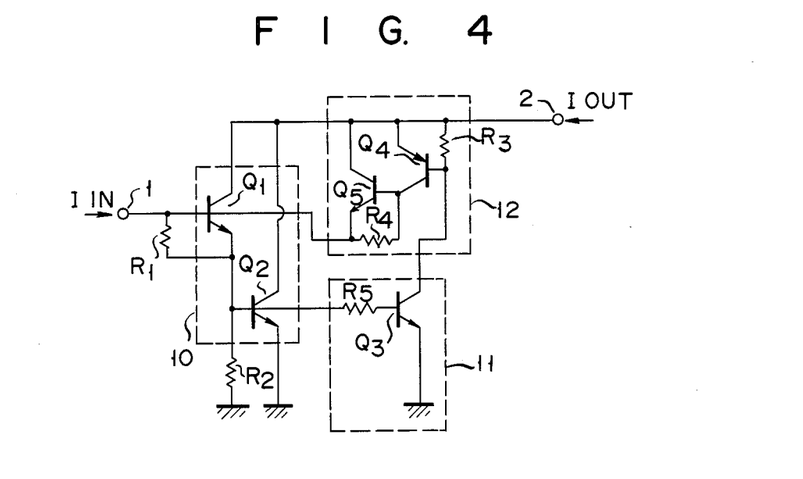
FIG. 4 is a diagram showing an output current driver circuit according to an embodiment of the present invention and shows an example of a detailed arrangement of the fundamental circuit shown in FIG. 3.

FIG. 4 is a circuit diagram showing a practical example of the circuit shown in FIG. 3.

$R_1$ to $R_4$ denote resistor elements each for absorbing a leakage current. Resistor element $R_1$ is connected between the base and emitter of pre-stage transistor $Q_1$. Resistor element $R_2$ is connected between the base and emitter of post-stage transistor $Q_2$.

In detection circuit 11, the base of an NPN transistor $Q_3$ is connected to the base of post-stage transistor $Q_2$, via a resistor element $R_5$ for limiting a base current. The emitter of transistor $Q_3$ is grounded, and the collector serves as an output terminal for detecting the ON-state of transistor $Q_2$.

In base current-supply circuit 12, the emitter of PNP transistor $Q_4$ is connected to output terminal 2, and the base is connected to the collector of transistor $Q_3$ of detection circuit 11. The base of an NPN transistor $Q_5$ is connected to the collector of transistor $Q_4$. The collector of transistor $Q_5$ is connected to output terminal 2, and the emitter is connected to the base of pre-stage transistor $Q_1$ of output circuit 10. Resistor element $R_3$ is connected between the base and emitter of PNP transistor $Q_4$. Resistor element $R_4$ is connected between the base and emitter of NPN transistor $Q_5$.

In the foregoing circuit, when post-stage transistor $Q_2$ is OFF, a sufficient amount of base current is not supplied to transistor $Q_3$ of detection circuit 11, with the result that transistor $Q_3$ is turned off. Thus, base current supply circuit 12 is also turned off. On the other hand, when transistor $Q_2$ is turned on by input current $I_{in}$, the base current is supplied to the base of transistor $Q_3$ of detection circuit 11, so that transistor $Q_3$ is turned on. Thus, base current-supply circuit 12 is also turned on. In this case, when a voltage across the base and emitter of transistor $Q_3$ is represented by $V_{BEQ3}$, and the current amplification factors of transistors $Q_3$, $Q_4$, and $Q_5$ are respectively represented by $h_{FEQ3}$, $h_{FEQ4}$, and $h_{FEQ5}$, the output current $I_1$ of the detection circuit will be $$I_1 = \frac{V_{BEQ2} - V_{BEQ3}}{R_6} \times h_{FEQ3} \qquad (6)$$

Conversely, the output current $I_2$ of base current supply circuit 12 will be $$\begin{aligned} I_2 &= I_1 \times h_{FEQ4} \times h_{FEQ5} \\ &= \frac{V_{BEQ2} - V_{BEQ3}}{R_6} \times h_{FEQ3} \times h_{FEQ4} \times h_{FEQ5} \end{aligned} \qquad (7)$$

Since the currents flowing through leak-absorbing resistor elements $R_1$ to $R_4$ are very small, they are ignored in expressions (6) and (7). NPN transistor $Q_5$ amplifies the output current of PNP transistor $Q_4$.

Figure 5:
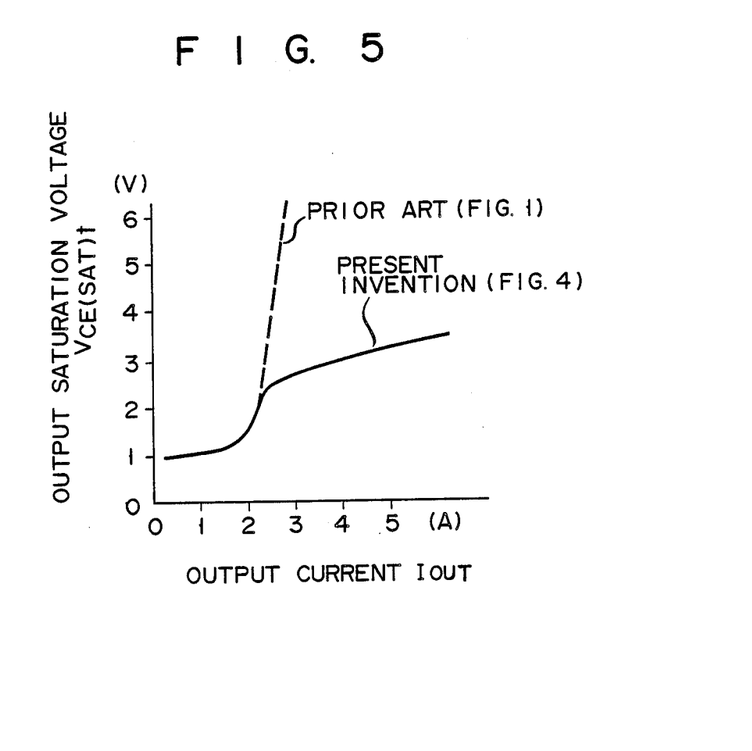
FIG. 5 is a diagram showing characteristic curves of output currents $I_{out}$ in relation to output saturation voltages $V_{CE(SET)t}$ in the circuits shown in FIGS. 1 and 4.

In FIG. 5, a solid line indicates a characteristic curve showing the relation between output saturation voltage $V_{CE(SAT)t}$ and output current $I_{out}$ in the circuit shown in FIG. 4. For comparison, a characteristic curve of the circuit of FIG. 1 is shown by a broken line, as a conventional example. As will be understood from these characteristic curves, when compared with the conventional example (FIG. 1) in which only input current $I_{in}$ is allowed to flow, as a base current through the output circuit comprising darlington-connected transistors $Q_1$ and $Q_2$, the output current can be remarkably increased, with the output saturation voltage suppressed to a low level, in the case of the embodiment (FIG. 5) in which the current (input current $I_{in}$+output current $I_2$ of the base current supply circuit) is allowed to flow as the base current.

Figure 6:
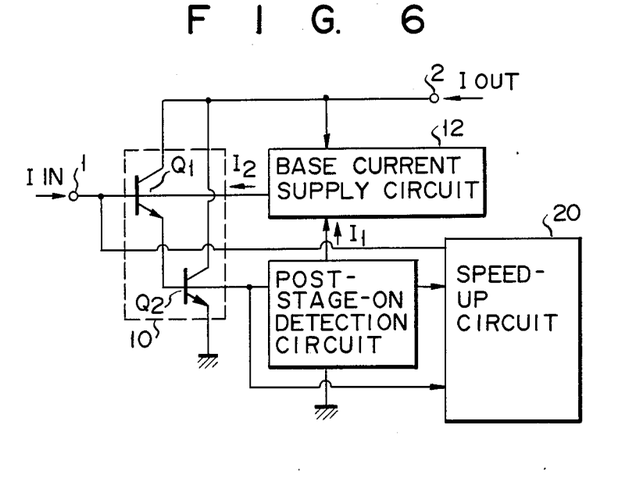
FIG. 6 is a diagram showing a circuit which is obtained by adding a speed-up circuit to the fundamental circuit shown in FIG. 3.

FIG. 6 is a diagram showing a circuit in which a speed-up circuit 20, for increasing switching speed, is added to the fundamental circuit shown in FIG. 3.

Figure 7:
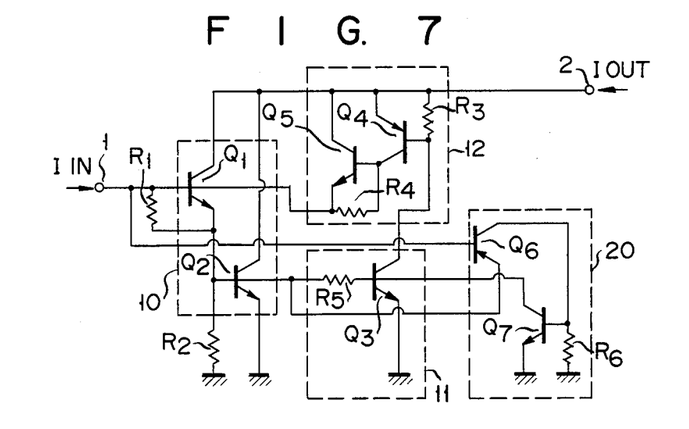
FIG. 7 is a diagram showing a detailed circuit arrangement of the circuit shown in FIG. 6 and FIGS. 8 to 11 are diagrams each showing an output current driver circuit according to another embodiment of the present invention, respectively.

FIG. 7 shows a practical example of the circuit of FIG. 6. The circuit of FIG. 7 is substantially the same as that shown in FIG. 4, apart from the addition of speed-up circuit 20.

$R_1$ to $R_4$ denote resistor elements each for absorbing a leakage current. Resistor element $R_1$ is connected between the base and emitter of pre-stage transistor $Q_1$. Resistor element $R_2$ is connected between the base and emitter of post-stage transistor $Q_2$.

In detection circuit 11, the base of an NPN transistor $Q_3$ is connected to the base of post-stage transistor $Q_2$, via a resistor element $R_5$ for limiting a base current. The emitter of transistor $Q_3$ is grounded, and the collector serves as an output terminal for detecting the ON-state of transistor $Q_2$.

In base current-supply circuit 12, the emitter of PNP transistor $Q_4$ is connected to output terminal 2, and the base is connected to the collector of transistor $Q_3$ of detection circuit 11. The base of an NPN transistor $Q_5$ is connected to the collector of transistor $Q_4$. The collector of transistor $Q_5$ is connected to output terminal 2, and the emitter is connected to the base of pre-stage transistor $Q_1$ of output circuit 10. Resistor element $R_3$ is connected between the base and emitter of PNP transistor $Q_4$. Resistor element $R_4$ is connected between the base and emitter of NPN transistor $Q_5$.

Speed-up circuit 20 comprises:

a PNP transistor $Q_6$ having its base connected to input terminal 1, and its emitter connected to the base of post-stage transistor $Q_2$ of output circuit 10;

an NPN transistor $Q_7$ having its base connected to the collector of transistor $Q_6$, its collector connected to the base of transistor $Q_3$ of detection circuit 11, and its emitter grounded; and a resistor element $R_6$ connected between the base and emitter of transistor $Q_7$.

Speed-up circuit 20 is provided to prevent transistors $Q_1$ and $Q_2$ from being turned off when input current $I_{in}$ becomes zero. In other words, when input current $I_{in}$ becomes zero, if output transistor $Q_2$ is still in the ON-state, because of the switching delay, current $I_2$ flows through the base of output transistor $Q_1$, by means of detection circuit 11 and base current-supply circuit 12, with the result that transistors $Q_1$ and $Q_2$ are not turned off.

Speed-up circuit 20 operates in the following manner:

When input current $I_{in}$ is supplied, transistor $Q_6$ is turned off, which then turns off transistor $Q_7$. When input current $I_{in}$ becomes zero, transistor $Q_6$ is turned on, which then turns on transistor $Q_7$. When transistor $Q_7$ is turned on, transistor $Q_3$ of detection circuit 11 is turned off, as are transistors $Q_4$ and $Q_5$ of base current supply circuit 12, thereby stopping the operation of base current-supply circuit 12. In this way, transistors $Q_1$ and $Q_2$ can operate so as to follow a change in the input signal of input terminal 1 by means of speed-up circuit 20.

Figure 8:
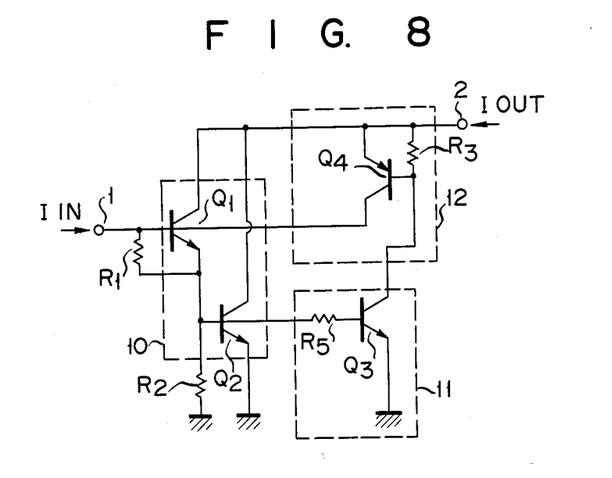
Figure 9:
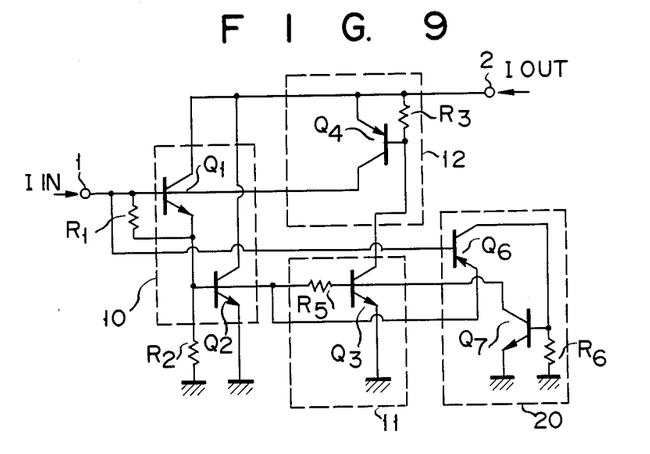
Figure 10:
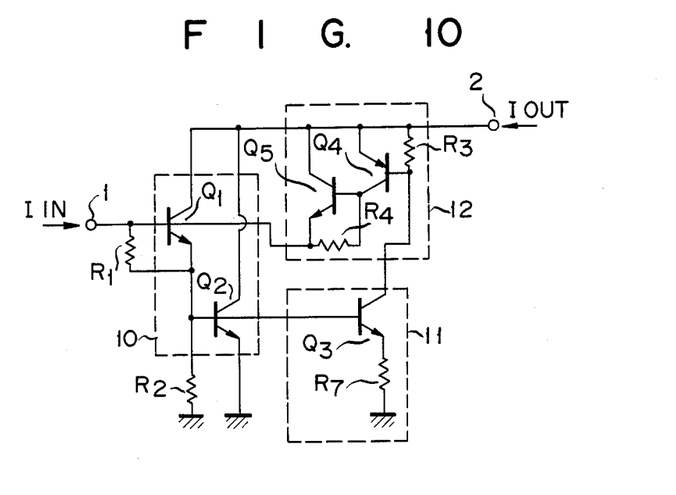
Figure 11:
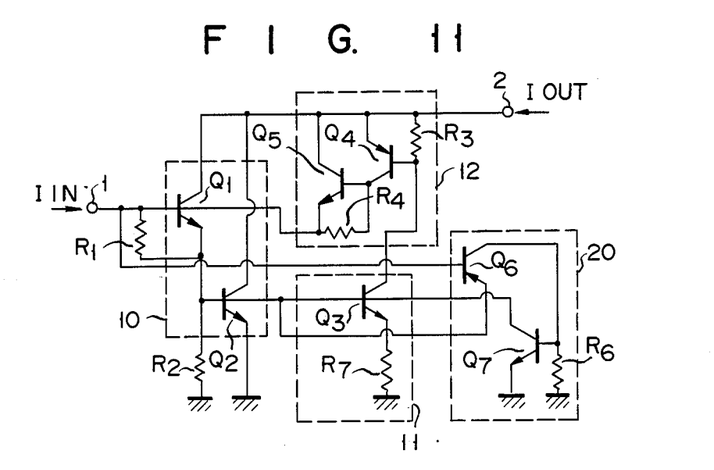

The present invention is not limited to the foregoing embodiments. In the case of base current-supply circuit 12, NPN transistor $Q_5$ may be omitted, and the collector current of PNP transistor $Q_4$ may be also used as output current $I_2$, as is shown in FIGS. 8 and 9. Detection circuit 11 may be also modified in a manner such that, as is shown in FIGS. 10 and 11, the base of transistor $Q_3$ is directly connected to the base of post-stage transistor $Q_2$, without passing through a resistor $R_6$ and a resistor element $R_7$ is inserted into the emitter circuit of transistor $Q_3$. In FIGS. 8 to 11, the same parts and elements as those shown in FIGS. 4 and 6 are designated by the same reference numerals, and their descriptions are therefore omitted.

As has been described above, according to the output current driver circuit of the present invention, the output circuit consisting of two darlington-connected NPN transistors is used, and a few circuits are added, so that the output current can be increased, with only a small increase in size and cost of the circuit chip. Therefore, the present invention is highly suitable as an output current driver circuit which is provided in a bipolar integrated circuit such as an interface driver and the like.

What is claimed is:

1. An output current driver circuit formed in an integrated circuit comprising:

a current input terminal;

a current output terminal;

a predetermined potential terminal;

an output circuit for outputting a current, comprising darlington-connected first and second transistors of NPN type each having a base, an emitter, and a collector, said first transistor forming a pre-stage transistor and said second transistor forming a post-stage transistor, said base, said collector, and said emitter of said first transistor being coupled to said current input terminal, said current output terminal, and said predetermined potential terminal, respectively, said base, said collector, and said emitter of said second transistor being coupled to said emitter of said first transistor, said current output terminal, and said predetermined potential terminal, respectively;

a post-stage on-detection circuit for detecting when said second transistor is turned on and for generating an on-detection signal, said post-stage on-detection circuit comprising a third transistor of NPN type having a base, an emitter, and a collector, said base and said emitter of said third transistor being connected to said base of said second transistor and said predetermined potential terminal, respectively;

a base current supply circuit for suplying a current to said base of said first transistor upon receipt of said on-detection signal and comprising a fourth transistor of PNP type having a base, an emitter, and a collector, said base, said collector, and said emitter of said fourth transistor being coupled to said collector of said third transistor, said base of said first transistor, and said output current terminal, respectively.

2. An output current driver circuit according to claim 1, further comprising first, second, third and fourth resistors, said first resistor being connected between said base and said emitter of said first transistor, said second resistor being connected between said base and said emitter of said second transistor, said third resistor being connected between said base of said second transistor and said base of said third transistor, and said fourth resistor being connected between said base and said emitter of said fourth transistor.

3. An output current driver circuit according to claim 1, further comprising a speed-up circuit which comprises a fifth transistor of PNP type having a base, an emitter, and a collector, said base and said emitter of said fifth transistor being connected to said current input terminal and said base of said second transistor, respectively, and a sixth transistor of NPN type having a base, an emitter, and a collector, said base, said collector, and said emitter of said sixth transistor being connected to said collector of said fifth transistor, said base of said third transistor, and said predetermined potential terminal, respectively.

4. An output current driver circuit according to claim 3, in which said speed-up circuit further comprises a resistor connected between said base of said sixth transistor and said predetermined potential terminal.

5. An output current driver circuit according to claim 1, in which said base current supply circuit further comprises a fifth transistor of NPN type having a base, an emitter, a collector, and a base-emitter path of said base and said emitter, said base-emitter path of said fifth transistor being between said collector of said fourth transistor and said base of said first transistor, said base, said collecotr, and said emitter of said fifth transistor being connected to said collector of said fourth transistor, said current output terminal, and said base of said first transistor, respectively.

6. An output current driver circuit according to claim 5, further comprising first, second, third, fourth and fifth resistors, said first resistor being connected between said base and said emitter of said first transistor, said second resistor being connected between said base and said emitter of said second transistor, said third resistor being connected between said base of said second transistor and said base of said third transistor, said fourth resistor being connected between said base and said emitter of said fourth transistor, and said fifth resistor being connected between said base and said emitter of said fifth transistor.

7. An output current driver circuit according to claim 5, further comprising a speed-up circuit which comprises a sixth transistor of PNP type having a base, an emitter, and a collector, said base and said emitter of said sixth transistor being connected to said current input terminal and said base of said second transistor, respectively, and a seventh transistor of NPN type having a base, an emitter, and a collector, said base, said collector, and said emitter of said seventh transistor being connected to said collector of said sixth transistor, said base of said third transistor, and said predetermined potential terminal, respectively.

8. An output current driver circuit according to claim 7, in which said speed-up circuit further comprises a resistor connected between said base of said seventh transistor and said predetermined potential terminal.

9. An output current driver circuit according to claim 5, further comprising first, second, third, fourth, and fifth resistors, said first resistor being connected between said base and said emitter of said first transistor, said second resistor being connected between said base and said emitter of said second transistor, said third resistor being inserted between said emitter of said third transistor and said predetermined potential terminal, said fourth resistor being connected between said base and said emitter of said fourth transistor, and said fifth resistor being connected between said base and said emitter of said fifth transistor.

10. An output current driver circuit according to claim 9, further comprising a speed-up circuit which comprises a sixth transistor of PNP type having a base, an emitter, and a collector, said base and said emitter of said sixth transistor being connected to said current input terminal and said base of said second trasnistor, respectively, and a seventh transistor of NPN type having a base, an emitter, and a collector, said base, said collector, and said emitter of said seventh transistor being connected to said collector of said sixth transistor, said base of said third transistor, and said predetermined potential terminal, respectively.

11. An output current driver circuit according to claim 10, in which said speed-up circuit further comprises a resistor connected between said base of said seventh transistor and said predetermined potential terminal.

* * * * *